(12) United States Patent
Okuno et al.

(10) Patent No.: US 10,967,433 B2
(45) Date of Patent: Apr. 6, 2021

(54) CUTTING TOOL

(71) Applicant: SUMITOMO ELECTRIC HARDMETAL CORP., Itami (JP)

(72) Inventors: Susumu Okuno, Itami (JP); Shinya Imamura, Itami (JP); Yuki Rikiso, Itami (JP); Yasuki Kido, Itami (JP); Fumiyoshi Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 16/981,099

(22) PCT Filed: Dec. 12, 2019

(86) PCT No.: PCT/JP2019/048724
§ 371 (c)(1),
(2) Date: Sep. 15, 2020

(87) PCT Pub. No.: WO2020/170572
PCT Pub. Date: Aug. 27, 2020

(65) Prior Publication Data
US 2020/0406367 A1 Dec. 31, 2020

(30) Foreign Application Priority Data

Feb. 19, 2019 (JP) .............................. JP2019-027258

(51) Int. Cl.
*B24D 3/02* (2006.01)
*B23B 27/14* (2006.01)
(Continued)

(52) U.S. Cl.
CPC .......... *B23B 27/148* (2013.01); *B23B 27/141* (2013.01); *B23C 5/16* (2013.01);
(Continued)

(58) Field of Classification Search
CPC combination set(s) only.
See application file for complete search history.

(56) References Cited

U.S. PATENT DOCUMENTS

2007/0009763 A1* 1/2007 Littecke .................. C23C 16/56
428/698
2007/0298281 A1* 12/2007 Andersson ............ C23C 16/403
428/698
(Continued)

FOREIGN PATENT DOCUMENTS

JP  2012-512753 A  6/2012
JP  2012-213853 A  11/2012
(Continued)

*Primary Examiner* — James E McDonough
(74) *Attorney, Agent, or Firm* — Faegre Drinker Biddle & Reath LLP

(57) ABSTRACT

A cutting tool comprises a substrate and a coating that coats the substrate, the coating including an α-alumina layer, the α-alumina layer including crystal grains of α-alumina, the α-alumina layer including a lower portion and an upper portion, the upper portion being occupied in area at a ratio of 50% or more by crystal grains of α-alumina having (006) plane with a normal thereto having a direction within ±15° with respect to a direction of a normal to the second interface, the lower portion being occupied in area at a ratio of 5% or more and less than 50% by crystal grains of α-alumina having (012) plane, (104) plane, (110) plane, (113) plane, (116) plane, (300) plane, (214) plane and (006) plane each with a normal thereto having a direction within ±15° with respect to the direction of the normal to the second interface.

5 Claims, 6 Drawing Sheets

(51) Int. Cl.
   *B23C 5/16* (2006.01)
   *B24D 3/00* (2006.01)
   *B24D 11/00* (2006.01)
   *B24D 18/00* (2006.01)
   *C09K 3/14* (2006.01)

(52) U.S. Cl.
   CPC ....... *B23B 2222/04* (2013.01); *B23B 2224/32* (2013.01); *B23C 2222/04* (2013.01); *B23C 2224/32* (2013.01)

(56) References Cited

U.S. PATENT DOCUMENTS

| | | | |
|---|---|---|---|
| 2007/0298282 A1* | 12/2007 | Andersson | B24C 7/0007 428/698 |
| 2009/0068371 A1* | 3/2009 | Littecke | C23C 16/56 427/427 |
| 2011/0247465 A1 | 10/2011 | Lind et al. | |
| 2017/0259345 A1* | 9/2017 | Detani | C23C 30/005 |
| 2018/0274091 A1* | 9/2018 | Chen | C23C 16/403 |

FOREIGN PATENT DOCUMENTS

| | | |
|---|---|---|
| WO | WO-2017/061059 A1 | 4/2017 |
| WO | WO-2018/001786 A1 | 1/2018 |

* cited by examiner

CUTTING TOOL

TECHNICAL FIELD

The present disclosure relates to a cutting tool. The present application claims priority based on Japanese Patent Application No. 2019-027258 filed on Feb. 19, 2019. The disclosure in the Japanese patent application is entirely incorporated herein by reference.

BACKGROUND ART

Cutting tools having a coated substrate have conventionally been used. For example, WO 2017/061059 (PTL 1) discloses a surface-coated cutting tool comprising a substrate and a coating formed on the substrate, the coating including an $\alpha$-$Al_2O_3$ layer satisfying b–a>0.5, where a representing an average value of a texture coefficient TC(006) in a vicinity of a cutting edge ridge line and b represents an average value of the texture coefficient TC(006) in other than the vicinity of the cutting edge ridge line.

Japanese Patent Laying-Open No. 2012-213853 (PTL 2) discloses a coated cutting tool insert of cemented carbide comprising a generally polygonal or circular body having at least one rake face and at least one flank face, the coating including an $\alpha$-$Al_2O_3$ layer having a diffraction intensity ratio I of 1.3 or more in X-ray diffractometry.

CITATION LIST

Patent Literature

PTL 1: WO 2017/061059
PTL 2: Japanese Patent Laying-Open No. 2012-213853

SUMMARY OF INVENTION

The presently disclosed cutting tool comprises a substrate and a coating that coats the substrate,
the coating including an $\alpha$-alumina layer provided on the substrate,
the $\alpha$-alumina layer including crystal grains of $\alpha$-alumina,
the $\alpha$-alumina layer including a lower portion and an upper portion,
the lower portion being a region sandwiched between an imaginary plane A and an imaginary plane B, the imaginary plane A being an imaginary plane which passes through a point 0.2 μm away in a direction of thickness from a first interface located on a side of the substrate and is parallel to the first interface, the imaginary plane B being an imaginary plane which passes through a point 1.3 μm further away from the imaginary plane A in the direction of thickness and is parallel to the first interface, the upper portion being a region sandwiched between an imaginary plane C and an imaginary plane D, the imaginary plane C being an imaginary plane which passes through a point 0.5 μm away in the direction of thickness from a second interface opposite to the side of the substrate and is parallel to the second interface, the imaginary plane D being an imaginary plane which passes through a point 1 μm further away from the imaginary plane C in the direction of thickness and is parallel to the second interface,
the first interface being parallel to the second interface,
when a cross section of the $\alpha$-alumina layer obtained when cut along a plane including a normal to the second interface is subjected to an electron backscattering diffraction image analysis using a field emission scanning microscope to determine a crystal orientation of each of the crystal grains of $\alpha$-alumina and a color map is created based thereon,
then, in the color map,
the upper portion being occupied in area at a ratio of 50% or more by crystal grains of $\alpha$-alumina having a (006) plane with a normal thereto having a direction within ±15° with respect to a direction of the normal to the second interface,
the lower portion being occupied in area at a ratio of 5% or more and less than 50% by crystal grains of $\alpha$-alumina having a (012) plane, a (104) plane, a (110) plane, a (113) plane, a (116) plane, a (300) plane, a (214) plane and a (006) plane each with a normal thereto having a direction within ±15° with respect to the direction of the normal to the second interface,
the $\alpha$-alumina layer having a thickness of 3 μm or more and 20 μm or less.

DETAILED DESCRIPTION

Figure 1:
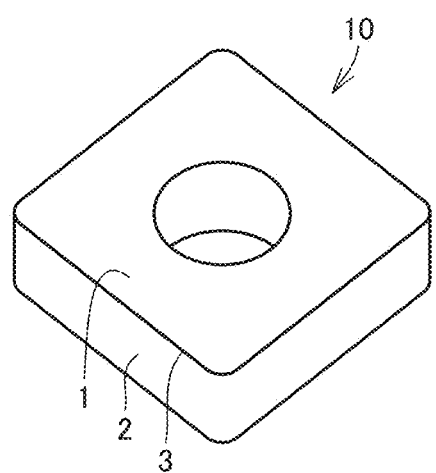
FIG. 1 is a perspective view for illustrating a substrate of a cutting tool in one manner.

Problems to be Solved by the Present Disclosure

In PTLs 1 and 2, a coating including an $\alpha$-$Al_2O_3$ layer, as configured as described above, is expected to improve a cutting tool's mechanical properties such as wear resistance and breaking resistance (e. g., chipping resistance) and hence increases its lifetime.

However, faster and more efficient cutting processes in recent years tend to impose increased loads on cutting tools and reduce their lifetimes. Accordingly, there is a demand for a cutting tool having a coating with further improved mechanical properties.

The present disclosure has been made in view of the above circumstances, and an object thereof is to provide a cutting tool having enhanced chipping resistance.

Advantageous Effect of the Present Disclosure

According to the present disclosure, a cutting tool having enhanced chipping resistance can be provided.

Description of Embodiments of the Present Disclosure

Initially, embodiments of the present disclosure will be listed and specifically described.

[1] The presently disclosed cutting tool includes
a substrate and a coating that coats the substrate,
the coating including an α-alumina layer provided on the substrate,
the α-alumina layer including crystal grains of α-alumina,
the α-alumina layer including a lower portion and an upper portion,
the lower portion being a region sandwiched between an imaginary plane A and an imaginary plane B, the imaginary plane A being an imaginary plane which passes through a point 0.2 µm away in a direction of thickness from a first interface located on a side of the substrate and is parallel to the first interface, the imaginary plane B being an imaginary plane which passes through a point 1.3 µm further away from the imaginary plane A in the direction of thickness and is parallel to the first interface,
the upper portion being a region sandwiched between an imaginary plane C and an imaginary plane D, the imaginary plane C being an imaginary plane which passes through a point 0.5 µm away in the direction of thickness from a second interface opposite to the side of the substrate and is parallel to the second interface, the imaginary plane D being an imaginary plane which passes through a point 1 µm further away from the imaginary plane C in the direction of thickness and is parallel to the second interface,
the first interface being parallel to the second interface,
when a cross section of the α-alumina layer obtained when cut along a plane including a normal to the second interface is subjected to an electron backscattering diffraction image analysis using a field emission scanning microscope to determine a crystal orientation of each of the crystal grains of α-alumina and a color map is created based thereon,
then, in the color map,
the upper portion being occupied in area at a ratio of 50% or more by crystal grains of α-alumina having a (006) plane with a normal thereto having a direction within ±15° with respect to a direction of the normal to the second interface,
the lower portion being occupied in area at a ratio of 5% or more and less than 50% by crystal grains of α-alumina having a (012) plane, a (104) plane, a (110) plane, a (113) plane, a (116) plane, a (300) plane, a (214) plane and a (006) plane each with a normal thereto having a direction within ±15' with respect to the direction of the normal to the second interface,
the α-alumina layer having a thickness of 3 µm or more and 20 µm or less.

The above cutting tool thus configured has enhanced chipping resistance. As used herein, "chipping resistance" means resistance to small chipping of coating.

[2] The coating further includes an inner layer provided between the substrate and the α-alumina layer, and
the inner layer includes TiCN. By this definition, wear resistance is enhanced in addition to chipping resistance.

[3] The coating further includes an intermediate layer provided between the inner layer and the α-alumina layer,
the intermediate layer includes a compound composed of: elemental titanium; and at least one element selected from the group consisting of carbon, nitrogen, boron and oxygen, and
the intermediate layer is different in composition from the inner layer. By this definition, adhesion between the substrate and the coating is enhanced in addition to chipping resistance.

[4] The coating further includes an outermost layer provided on the α-alumina layer, and the outermost layer includes a compound composed of: an elemental titanium; and one element selected from the group consisting of carbon, nitrogen and boron. By this definition, a cutting tool excellent in that a coating is identified, in addition to chipping resistance, can be provided.

[5] The coating has a thickness of 3 µm or more and 30 µm or less. By this definition, a cutting tool excellent in wear resistance in addition to chipping resistance can be provided.

Details of Embodiments of the Present Disclosure

Hereinafter, an embodiment of the present disclosure (hereinafter also referred to as "the present embodiment") will be described. It should be noted, however, that the present embodiment is not exclusive. In the present specification, an expression in the form of "X to Y" means a range's upper and lower limits (that is, X or more and Y or less), and when X is not accompanied by any unit and Y is alone accompanied by a unit, X has the same unit as Y. Further, in the present specification, when a compound is represented by a chemical formula with its constituent element composition ratio unspecified, such as "TiC," the chemical formula shall encompass any conventionally known composition ratio (or elemental ratio). The chemical formula shall include not only a stoichiometric composition but also a nonstoichiometric composition. For example, the chemical formula of "TiC" includes not only a stoichiometric composition of "$Ti_1C_1$" but also a non-stoichiometric composition for example of "$Ti_1C_{0.8}$." This also applies to compounds other than "TiC."

<<Surface-Coated Cutting Tool>>

The presently disclosed cutting tool is
a cutting tool including a substrate and a coating that coats the substrate,
the coating including an $α-Al_2O_3$ layer (α-alumina layer) provided on the substrate,
the $α-Al_2O_3$ layer including crystal grains of $α-Al_2O_3$ (α-alumina),
the $α-Al_2O_3$ layer including a lower portion and an upper portion,
the lower portion being a region sandwiched between an imaginary plane A and an imaginary plane B, the imaginary plane A being an imaginary plane which passes through a point 0.2 µm away in a direction of thickness from a first interface located on a side of the substrate and is parallel to the first interface, the imaginary plane B being an imaginary plane which passes through a point 1.3 µm further away from the imaginary plane A in the direction of thickness and is parallel to the first interface,
the upper portion being a region sandwiched between an imaginary plane C and an imaginary plane D, the imaginary plane C being an imaginary plane which passes through a point 0.5 µm away in the direction of thickness from a second interface opposite to the side of the substrate and is parallel to the second interface, the imaginary plane D being an imaginary plane which passes through a point 1 µm further away from the imaginary plane C in the direction of thickness and is parallel to the second interface,
the first interface being parallel to the second interface,
when a cross section of the $α-Al_2O_3$ layer obtained when cut along a plane including a normal to the second interface is subjected to an electron backscattering diffraction image analysis using a field emission scanning microscope to determine a crystal orientation of each of the crystal grains of $α-Al_2O_3$ and a color map is created based thereon, then, in the color map, the upper portion being occupied in area at a ratio of 50% or more by crystal grains of α-Al$_2$O$_3$ having a (006) plane with a normal thereto having a direction within ±15° with respect to a direction of the normal to the second interface, the lower portion being occupied in area at a ratio of 5% or more and less than 50% by crystal grains of α-Al$_2$O$_3$ having a (012) plane, a (104) plane, a (110) plane, a (113) plane, a (116) plane, a (300) plane, a (214) plane and a (006) plane each with a normal thereto having a direction within ±15° with respect to the direction of the normal to the second interface, the α-Al$_2$O$_3$ layer having a thickness of 3 μm or more and 20 μm or less.

A surface-coated cutting tool (hereinafter also simply referred to as a "cutting tool") 50 of the present embodiment includes a substrate 10 and a coating 40 that coats substrate 10 (see FIG. 2). In one aspect of the present embodiment, the coating may coat a rake face of the substrate or may coat a portion other than the rake face (e.g., a flank face). The cutting tool can for example be a drill, an end mill, an indexable cutting insert for a drill, an indexable cutting insert for an end mill, an indexable cutting insert for milling, an indexable cutting insert for turning, a metal saw, a gear cutting tool, a reamer, a tap, or the like.

<Substrate>

The substrate of the present embodiment can be any substrate conventionally known as a substrate of this type. For example, it preferably includes at least one selected from the group consisting of a cemented carbide (for example, a tungsten carbide (WC)-base cemented carbide, a cemented carbide containing Co other than WC, a cemented carbide with a carbonitride of Cr, Ti, Ta, Nb, or the like other than WC added, or the like), a cermet (containing Tic, TiN, TiCN, or the like as a major component), a high-speed steel, ceramics (titanium carbide, silicon carbide, silicon nitride, aluminum nitride, aluminum oxide, and the like), a cubic boron nitride sintered material (a cBN sintered material), and a diamond sintered material, and more preferably includes at least one selected from the group consisting of cemented carbide, cermet, and cBN sintered material.

Of these various types of substrates, it is particularly preferable to select a WC-base cemented carbide or a cBN sintered material. This is because these substrates are particularly excellent in balance between hardness and strength at high temperature, in particular, and present excellent characteristics as a substrate for a cutting tool for the above-described application.

When using a cemented carbide as a substrate, the effect of the present embodiment is exhibited even if the cemented carbide has a structure including free carbon or an extraordinary phase referred to as β phase. Note that the substrate used in the present embodiment may have its surface modified. For example, for the cemented carbide, the surface may be provided with a η-free layer, and for the cermet, the surface may be provided with a surface hardened layer, and even if the surface is modified in this way the effect of the present embodiment is exhibited.

FIG. 1 is a perspective view for illustrating the substrate of the cutting tool in one manner. A substrate having such a shape is used as, for example, an indexable cutting insert for turning. Substrate 10 has a rake face 1, a flank face 2, and a cutting edge ridge portion 3 where rake face 1 and flank face 2 meet. That is, rake face 1 and flank face 2 are faces that are connected with cutting edge ridge portion 3 interposed therebetween. Cutting edge ridge portion 3 constitutes a tip of a cutting edge of substrate 10. Such a shape of substrate 10 can also be understood as a shape of the cutting tool.

When the cutting tool is an indexable cutting insert, substrate 10 also includes a shape with or without a chip breaker. Cutting edge ridge portion 3 is shaped to include any of a sharp edge (a ridge formed by a rake face and a flank face), a honed edge (a sharp edge processed to be rounded), a negative land (with beveling applied), and a combination of the honed edge and the negative land.

While the shape of substrate 10 and the name of each part thereof have been described with reference to FIG. 1, a shape in the cutting tool according to the present embodiment that corresponds to substrate 10 and the name of each part thereof will be indicated by similar terminology. That is, the cutting tool has a rake face, a flank face, and a cutting edge ridge portion connecting the rake face and the flank face together.

<Coating>

Figure 2:
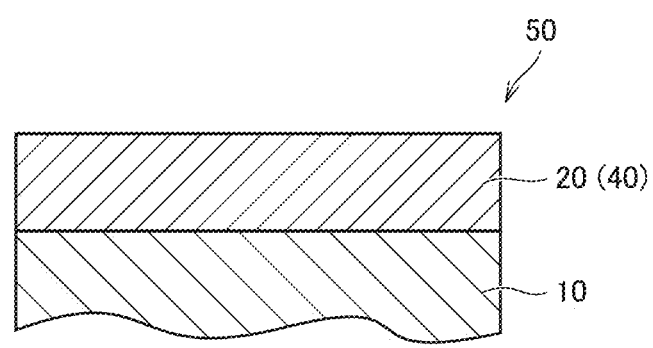
FIG. 2 is a schematic cross section of a cutting tool according to one embodiment in one manner.

Coating 40 according to the present embodiment includes an α-Al$_2$O$_3$ layer 20 provided on substrate 10 (see FIG. 2). The "coating" coats at least a part of the substrate (for example, a rake face coming into contact with a workpiece during cutting) to exhibit a function to improve the cutting tool's various characteristics such as breaking resistance (chipping resistance or the like), wear resistance, and the like. The coating is preferably applied not only to a part of the substrate but also to the entire surface of the substrate. However, even if the substrate is partially uncoated with the coating or the coating is partially different in configuration, such does not depart from the scope of the present embodiment.

The coating preferably has a thickness of 3 μm or more and 30 μm or less, more preferably 5 μm or more and 25 μm or less. Note that the thickness of the coating means a total in thickness of any layers constituting the coating. A "layer constituting the coating" includes an α-Al$_2$O$_3$ layer, an intermediate layer, an inner layer, an outermost layer, and the like described hereinafter. For example, the thickness of the coating is measured by measuring any 10 points in a sample in a cross section parallel to the direction of a normal to a surface of the substrate with a scanning transmission electron microscope (STEM), and calculating an average value of the measured 10 points in thickness. The same applies when measuring in thickness the α-Al$_2$O$_3$ layer, the intermediate layer, the inner layer, the outermost layer, and the like described hereinafter. The scanning transmission electron microscope is JEM-2100F (trade name) manufactured by JEOL Ltd., for example.

(α-Al$_2$O$_3$ Layer)

The α-Al/O$_3$ layer of the present embodiment includes crystal grains of α-Al$_2$O$_3$ (i.e., aluminium oxide having an α-type crystal structure) (hereinafter also simply referred to as "crystal grains"). In other words, the α-Al$_2$O$_3$ layer is a layer including polycrystalline α-Al$_2$O$_3$.

That is, the α-Al$_2$O$_3$ layer may be provided directly on the substrate or may be provided on the substrate via another layer such as an inner layer, an intermediate layer, or the like described hereinafter insofar as such does not impair an effect of the cutting tool according to the present embodiment. The α-Al$_2$O$_3$ layer may be provided thereon with another layer such as an outermost layer. The α-Al$_2$O$_3$ layer may be an outermost layer (an outermost surface layer) of the coating.

The α-Al$_2$O$_3$ layer has the following feature: That is, the α-Al$_2$O$_3$ layer includes a lower portion and an upper portion, the lower portion being a region sandwiched between an imaginary plane A and an imaginary plane B, the imaginary plane A being an imaginary plane which passes through a point 0.2 μm away in a direction of thickness from a first interface located on a side of the substrate and is parallel to the first interface, the imaginary plane B being an imaginary plane which passes through a point 1.3 μm further away from the imaginary plane A in the direction of thickness and is parallel to the first interface, the upper portion being a region sandwiched between an imaginary plane C and an imaginary plane D, the imaginary plane C being an imaginary plane which passes through a point 0.5 μm away in the direction of thickness from a second interface opposite to the side of the substrate and is parallel to the second interface, the imaginary plane D being an imaginary plane which passes through a point 1 μm further away from the imaginary plane C in the direction of thickness and is parallel to the second interface, the first interface being parallel to the second interface, when a cross section of the α-$Al_2O_3$ layer obtained when cut along a plane including a normal to the second interface is subjected to an electron backscattering diffraction image analysis using a field emission scanning microscope to determine a crystal orientation of each of the crystal grains of α-$Al_2O_3$ and a color map is created based thereon, then, in the color map, the upper portion being occupied in area at a ratio of 50% or more by crystal grains of α-$Al_2O_3$ having a (006) plane with a normal thereto having a direction within ±15° with respect to a direction of the normal to the second interface (hereinafter also referred to as (006) plane-oriented crystal grains), the lower portion being occupied in area at a ratio of 5% or more and less than 50% by crystal grains of α-$Al_2O_3$ having a (012) plane, a (104) plane, a (110) plane, a (113) plane, a (116) plane, a (300) plane, a (214) plane and a (006) plane each with a normal thereto having a direction within ±15° with respect to the direction of the normal to the second interface.

In other words, the lower portion is such that a ratio in area of the lower portion occupied by crystal grains of α-$Al_2O_3$ having the (012) plane with a normal thereto having a direction within ±15 with respect to the direction of the normal to the second interface, a ratio in area of the lower portion occupied by crystal grains of α-$Al_2O_3$ having the (104) plane with a normal thereto having a direction within ±15° with respect to the direction of the normal to the second interface, a ratio in area of the lower portion occupied by crystal grains of α-$Al_2O_3$ having the (110) plane with a normal thereto having a direction within ±15° with respect to the direction of the normal to the second interface, a ratio in area of the lower portion occupied by crystal grains of α-$Al_2O_3$ having the (113) plane with a normal thereto having a direction within ±15° with respect to the direction of the normal to the second interface, a ratio in area of the lower portion occupied by crystal grains of α-$Al_2O_3$ having the (116) plane with a normal thereto having a direction within +15° with respect to the direction of the normal to the second interface, a ratio in area of the lower portion occupied by crystal grains of α-$Al_2O_3$ having the (300) plane with a normal thereto having a direction within ±15° with respect to the direction of the normal to the second interface, a ratio in area of the lower portion occupied by crystal grains of α-$Al_2O_3$ having the (214) plane with a normal thereto having a direction within ±15° with respect to the direction of the normal to the second interface, and a ratio in area of the lower portion occupied by crystal grains of α-$Al_2O_3$ having the (006) plane with a normal thereto having a direction within ±15° with respect to the direction of the normal to the second interface, are each 5% or more and 50% or less.

Figure 4:
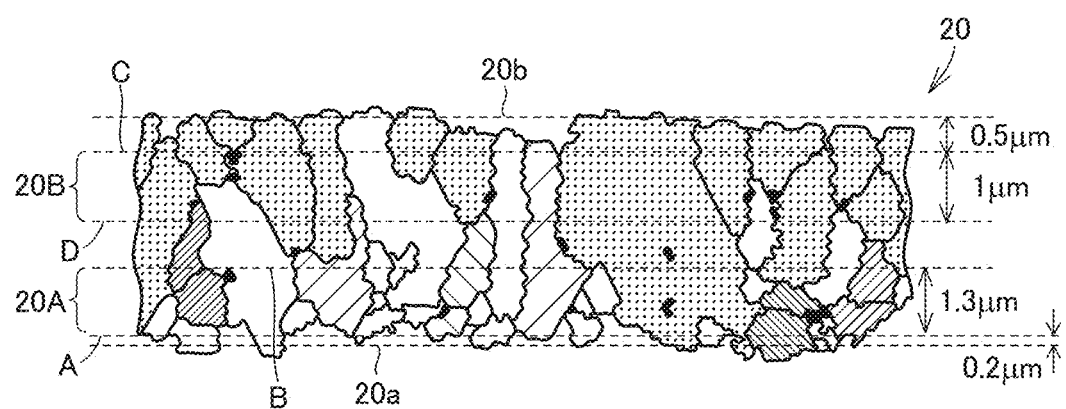
FIG. 4 is a part of a color map created based on a cross section of an $\alpha$-$Al_2O_3$ layer when a coating is cut along a plane including a normal to a second interface of the $\alpha$-$Al_2O_3$ layer.

Reference will now be made to FIG. 4 to specifically describe a method for creating the color map. FIG. 4 is a part of a color map created based on a cross section of the α-$Al_2O_3$ layer when the coating is cut along a plane including a normal to the second interface of the α-$Al_2O_3$ layer. A first interface 20a of α-$A_2O_3$ layer 20 shown in FIG. 4 is an interface located on the side of substrate 10, and a second interface 20b thereof is an interface located opposite to the side of substrate 10. First interface 20a is parallel to second interface 20b. When α-$Al_2O_3$ layer 20 is an outermost layer of the coating, second interface 20b will be a surface of α-$Al_2O_3$ layer 20. First interface 20a is a straight line that passes a center between a straight line L1 that passes through a point on the side of the substrate farthest from the substrate in the direction of a normal to a major surface of the substrate in the color map and is also parallel to the major surface of the substrate and a straight line L2 that passes through a point on the side of the substrate closest to the substrate in the same direction and is also parallel to the major surface of the substrate. Second interface 20b is a straight line that passes a center between a straight line M1 that passes through a point on the side opposite to the substrate farthest from the substrate in the direction of the normal to the major surface of the substrate in the color map and is also parallel to the major surface of the substrate and a straight line M2 that passes through a point on the side opposite to the substrate closest to the substrate in the same direction and is also parallel to the major surface of the substrate. Note, however, that an apparently unexpected point is excluded in selecting the "point closest to the substrate" and the "point farthest from the substrate."

Initially, the α-$Al_2O_3$ layer is formed on the substrate based on a method described hereinafter. The formed α-$Al_2O_3$ layer is cut so as to obtain a cross section perpendicular to the α-$Al_2O_3$ layer including the substrate and the like. That is, the cutting is done so as to expose a cut surface of the α-$Al_2O_3$ layer cut along a plane including a normal to second interface 20b. After that, the cut surface is polished with waterproof abrasive paper (including SiC grain abrasive as an abrasive).

Note that the cutting is done for example as follows: wax or the like is used to closely fix α-$Al_2O_3$ layer 20 at a surface thereof (or a surface of the coating when another layer is formed on α-$Al_2O_3$ layer 20) on a sufficiently large holding flat plate and thereafter, a rotary blade cutter is used to cut the layer in a direction perpendicular to the flat plate (i.e., cut the layer such that the rotary blade is as vertical as possible to the flat plate). While this cutting can be performed at any portion of α-$Al_2O_3$ layer 20 insofar as it is performed in such a vertical direction, it is done preferably in a vicinity of cutting edge ridge portion 3, more preferably in a vicinity of cutting edge ridge portion 3 at a location where substrate 10 is relatively flat, as will be described hereinafter.

Furthermore, the cut surface is polished, as described above, with the above waterproof abrasive paper (with #400, followed by #800 followed by #1500). The numbers (#) of the waterproof abrasive paper mean differences in grain size of the abrasive, and a larger number indicates that the abrasive has a smaller grain size.

Subsequently, the polished surface is further smoothed by ion milling using Ar ions. The ion milling was performed under the following conditions:
Acceleration voltage: 6 kV
Irradiation angle: 0° from the direction of a normal to the second interface of the α-Al$_2$O$_3$ layer (that is, the direction of a straight line parallel to the direction of the thickness of the α-Al$_2$O$_3$ layer at the cut surface)
Irradiation time: 6 hours Subsequently the smoothed cross-section (a mirror surface) is observed with a field emission type scanning electron microscope (FE-SEM) (product name: "SU6600" manufactured by Hitachi High-Tech Corporation) equipped with an electron back-scattered diffractometer (an EBSD device) to obtain an image, which is subjected to an EBSD analysis. While where the smoothed cross section is observed is not particularly limited, it is preferably observed in a vicinity of cutting edge ridge portion 3, more preferably in a vicinity of cutting edge ridge portion 3 at a location where substrate 10 is relatively flat, in view of a relationship with cutting characteristics. The observation with the FE-SEM is conducted at a magnification of 5000 times.

For the EBSD analysis, data is successively collected by positioning a focused electron beam on each pixel individually. A normal to a sample surface (the smoothed cross section of the α-Al$_2$O$_3$ layer) is inclined by 70 degrees with respect to the incident beam, and the analysis is conducted at 15 kV. In order to avoid a charging effect, a pressure of 10 Pa is applied. A high current mode is used in conformity with an aperture diameter of 60 μm or 120 μm. Data is collected on the cross section for 200×300 points corresponding to a surface area (an observation area) of 20 μm (in the direction of the thickness of the α-Al$_2$O$_3$ layer)×30 μm (in a direction parallel to an interface of the α-Al$_2$O$_3$ layer) in steps of 0.1 μm/step. In doing so, measurement is done in three or more fields of view.

A result of the EBSD analysis is analyzed using commercially available software (trade name: "Orientation Imaging Microscopy Ver 6.2," manufactured by EDAX Inc.) to create the color map. Specifically, initially, the crystal orientation of each crystal grain included in the cross section of α-Al$_2$O$_3$ layer 20 is determined. The crystal orientation of each crystal grain determined herein is a crystal orientation observed when each crystal grain appearing in the cross section of α-Al$_2$O$_3$ layer 20 is observed in a plan view in the direction of a normal to that cross section (i.e., a direction penetrating the plane of the sheet of FIG. 4). Then, based on the obtained crystal orientation of each crystal grain, the crystal orientation of each crystal grain in the direction of the normal to a surface of α-Al$_2$O$_3$ layer 20 (that is, second interface 20b) is determined. A color map is created based on the determined crystal orientation. To create the color map, a "Crystal Direction MAP" method included in the above software can be used. The color map is created throughout the entire area in the direction of the thickness of α-Al$_2$O$_3$ layer 20 as observed in the cut surface. In addition, a crystal grain partially outside a field of view for measurement is also counted as one crystal grain.

In FIG. 4, each area surrounded by a solid line and dotted is a (006) oriented crystal grain. Further, each area surrounded by a solid line and hatched (with six types of lines) or each area surrounded by a solid line and unhatched is a (012)-, (104)-, (110)-, (113)-, (116)-, (300)-, or (214)-oriented crystal grain. That is, in FIG. 4, a crystal grain having the (006) plane with a normal thereto having a direction within ±15° with respect to the direction of a normal to second interface 20b of α-Al$_2$O$_3$ layer 20 is dotted. A crystal grain having anyone crystal plane of the (012) plane, the (104) plane, the (110) plane, the (113) plane, the (116) plane, the (300) plane and the (214) plane with a normal thereto having a direction within ±15° with respect to the direction of the normal to second interface 20b of α-Al$_2$O$_3$ layer 20 will be hatched (with six types of lines) or unhatched. Furthermore, in FIG. 4, there is an area shown in black, which is regarded as an area of a crystal grain having its crystal orientation undetermined in the above method.

Furthermore, as shown in FIG. 4, α-Al$_2$O$_3$ layer 20 includes a lower portion 20A and an upper portion 20B.

Lower portion 20A is a region sandwiched between an imaginary plane A and an imaginary plane B, the imaginary plane A being an imaginary plane which passes through a point 0.2 μm away in a direction of thickness from first interface 20a located on a side of the substrate and is parallel to the first interface, the imaginary plane B being an imaginary plane which passes through a point 1.3 μm further away from the imaginary plane A in the direction of thickness and is parallel to the first interface. That is, a linear distance (or a minimum distance) between the imaginary plane A and the imaginary plane B is 1.3 μm and this will be the thickness of lower portion 20A. The imaginary plane A and the imaginary plane B can be set on the created color map based on a distance from the first interface.

Upper portion 20B is a region sandwiched between an imaginary plane C and an imaginary plane D, the imaginary plane C being an imaginary plane which passes through a point 0.5 μm away in the direction of thickness from second interface 20b opposite to the side of the substrate and is parallel to the second interface, the imaginary plane D being an imaginary plane which passes through a point 1 μm further away from the imaginary plane C in the direction of thickness and is parallel to the second interface. That is, a linear distance (or a minimum distance) between the imaginary plane C and the imaginary plane D is 1 μm and this will be the thickness of upper portion 20B. The imaginary plane C and the imaginary plane D can be set on the created color map based on a distance from the second interface.

In the color map, upper portion 20B is occupied in area at a ratio of 50% or more, preferably 50% or more and 90% or less, more preferably 60% or more and 85% or less by crystal grains of α-Al$_2$O$_3$ having a (006) plane with a normal thereto having a direction within ±15° with respect to the direction of a normal to second interface 20b. Herein, a ratio in area is a ratio in area with reference to the entirety in area of upper portion 20B in the color map.

In the color map, lower portion 20A is occupied in area at a ratio of 5% or more and less than 50%, preferably 5% or more and 40% or less, more preferably 7% or more and 35% or less by crystal grains of α-Al$_2$O$_3$ having a (012) plane, a (104) plane, a (110) plane, a (113) plane, a (116) plane, a (300) plane, a (214) plane, and a (006) plane each with a normal thereto having a direction within ±15° with respect to the direction of the normal to second interface 20b. Herein, a ratio in area is a ratio in area with reference to the entirety in area of lower portion 20A in the color map. Furthermore, some of the crystal grains of α-Al$_2$O$_3$ may have a plurality of crystal planes each with a normal thereto having a direction within ±15° with respect to the direction of the normal to second interface 20b. For example, among the crystal grains of α-Al$_2$O$_3$ above, there is a crystal grain which corresponds to a (006) oriented crystal grain and also corresponds to a (012) oriented crystal grain. In that case, the area of the crystal grain is added to both a ratio in area of (006) oriented crystal grains and that in area of (012)

oriented crystal grains. Therefore, a total of ratios in area obtained for the 8 types of crystal planes may exceed 100%.

Cutting tool 10 including α-Al$_2$O$_3$ layer 20 satisfying the above requirement has enhanced chipping resistance. This will be described in comparison with conventional art.

An approach conventionally taken to improve an α-Al$_2$O$_3$ layer's mechanical properties is by controlling a manner of each crystal in a surface of the α-Al$_2$O$_3$ layer to improve the α-Al$_2$O$_3$ layer's characteristics and hence those of a coating having the α-Al$_2$O$_3$ layer. Such a conventional approach is based on the idea that a surface of the α-Al$_2$O$_3$ layer is a portion subjected to a large load by cutting, and controlling the portion's characteristics controls those of the entirety of the α-Al$_2$O$_3$ layer. As such, no attention has been paid to the configuration of the Al$_2$O$_3$ layer in the direction of the thickness thereof. For example, while it has been known that an α-Al$_2$O$_3$ layer formed in a conventional manufacturing method has a lower portion having many crystal grains mainly exhibiting (214) orientation, no attention has been paid to controlling the orientation of the crystal grains in the lower portion.

However, the present inventors have considered that a breakthrough cannot be achieved only by the conventional approach in order to further increase the lifetime of a cutting tool. Accordingly, the present inventors have conducted a variety of studies focusing on a manner of each crystal in the α-Al$_2$O$_3$ layer in the direction of the thickness thereof, and found that a manner of crystals constituting the α-Al$_2$O$_3$ layer that are located on the side of the substrate significantly contributes to chipping resistance (or breaking resistance).

By a further investigation based on the above findings, the present inventors have obtained the following findings:
(1) the α-Al$_2$O$_3$ layer tends to be per se larger in hardness throughout as a ratio in area thereof occupied by (006) oriented crystal grains increases; and
(2) Further, when the α-Al$_2$O$_3$ layer has a lower portion having crystal grains with isotropic orientation, cracking caused in the coating is less likely to extend through the α-Al$_2$O$_3$ layer. As a result, chipping resistance tends to further increase.

A cutting tool 50 according to the present embodiment has been completed based on the above findings, and includes coating 40 having α-Al$_2$O$_3$ layer 20 having a crystal orientation varying in the direction of the thickness thereof. Specifically, α-Al$_2$O$_3$ layer 20 includes upper portion 20B occupied in area by (006) oriented crystal grains at a ratio of 50% or more, and lower portion 20A occupied in area by (012) oriented crystal grains, (104) oriented crystal grains, (110) oriented crystal grains, (113) oriented crystal grains, (116) oriented crystal grains, (300) oriented crystal grains, (214) oriented crystal grains, or (006) oriented crystal grains at a ratio of 5% or more and less than 50%.

Such α-Al$_2$O$_3$ layer 20 can have upper portion 20B to significantly enhance the cutting tool in hardness and thus allow the cutting tool to have large wear resistance. Furthermore, lower portion 20A has isotropic crystal grains, and cracking caused in the coating is less likely to extend through the α-Al$_2$O$_3$ layer. The present inventors consider that such chipping resistance as described above is exhibited therefore. Thus, coating 40 of the present embodiment is excellent in chipping resistance as well as wear resistance, and cutting tool 50 will have better mechanical properties than conventional.

(Thickness of α-Al$_2$O$_3$ Layer)

In the present embodiment, the α-Al$_2$O$_3$ layer has a thickness of 3 to 20 μm. The α-Al$_2$O$_3$ layer preferably has a thickness of 4 to 20 μm, more preferably 5 to 15 μm. This allows such an excellent effect as above to be presented. Herein, the thickness of the α-Al$_2$O$_3$ layer means a shortest distance from the first interface to the second interface.

When the α-Al$_2$O$_3$ layer has a thickness of less than 3 μm, wear resistance attributed to the presence of the α-Al$_2$O$_3$ layer tends to be less improved. When the α-Al$_2$O$_3$ layer has a thickness exceeding 20 μm, an interfacial stress attributed to a difference in linear expansivity between the α-Al$_2$O$_3$ layer and another layer increases, and crystal grains of α-Al$_2$O$_3$ may escape. Accordingly, when the α-Al$_2$O$_3$ layer has a middle portion between the upper portion and the lower portion, the middle portion will preferably have a thickness of 0 to 17 μm. Such a thickness can be confirmed by observing a vertical cross section of the substrate and the coating with a scanning transmission electron microscope (STEM) or the like, similarly as has been described above.

(Average Grain Size of Crystal Grains of α-Al$_2$O$_3$)

In the present embodiment, the crystal grains of α-Al$_2$O$_3$ preferably have an average grain size of 0.1 to 3 μm, and more preferably 0.2 to 2 μm. In one aspect of the present embodiment, the lower portion of α-Al$_2$O$_3$ includes crystal grains having an average grain size preferably of 0.1 to 2 μm, more preferably 0.1 to 1 μm. The crystal grain's average grain size can be determined from the color map for example. Specifically, initially, in the color map, a region which matches in color (that is, in crystal orientation) and is surround by a different color (that is, by a different crystal orientation) is regarded as a crystal grain's individual region. Subsequently, the crystal grain's area is determined and the diameter of a circle having the same area as that of the crystal grain is defined as the grain size of the crystal grain.

(Inner Layer)

Figure 3:
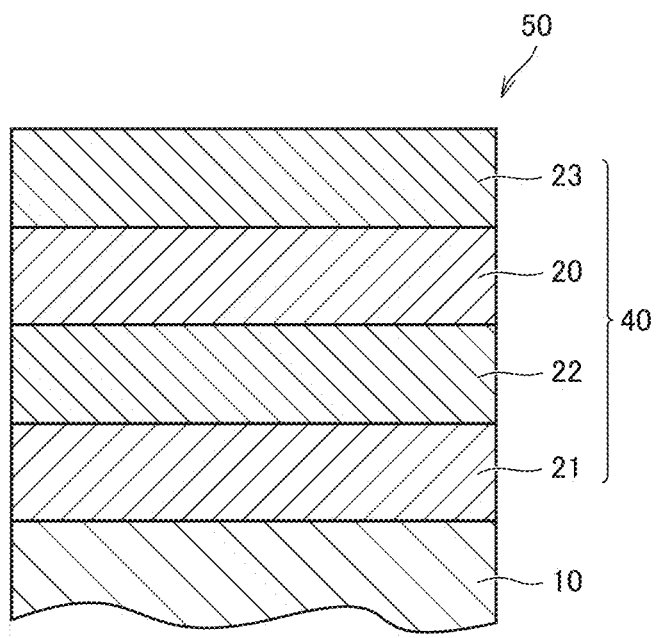
FIG. 3 is a schematic cross section of a cutting tool according to the present embodiment in another manner.

Preferably, coating 40 further includes an inner layer 21 provided between substrate 10 and α-Al$_2$O$_3$ layer 20 (see FIG. 3), and inner layer 21 includes TiCN. The TiCN preferably has a cubic crystal structure.

The inner layer preferably has a thickness of 3 to 20 μm, more preferably 5 to 15 μm. Such a thickness can be confirmed by observing a vertical cross section of the substrate and the coating with a scanning transmission electron microscope (STEM) or the like, similarly as has been described above.

(Intermediate Layer)

Preferably, coating 40 further includes an intermediate layer 22 provided between inner layer 21 and α-Al$_2$O$_3$ layer 20 (see FIG. 3) and intermediate layer 22 includes a compound composed of: elemental titanium; and at least one element selected from the group consisting of C (carbon), N (nitrogen), B (boron) and O (oxygen). The intermediate layer is different in composition from the inner layer.

Examples of the compound included in the intermediate layer include TiCNO, TiBN, and TiB$_2$.

The intermediate layer preferably has a thickness of 0.3-2.5 μm, more preferably 0.5-1 μm. Such a thickness can be confirmed by observing a vertical cross section of the substrate and the coating with a scanning transmission electron microscope (STEM) or the like, similarly as has been described above.

(Outermost Layer)

Preferably, coating 40 further includes an outermost layer 23 provided on α-Al$_2$O$_3$ layer 20 (see FIG. 3) and outermost layer 23 includes a compound composed of: elemental titanium; and one element selected from the group consisting of C, N and B.

Examples of the compound included in the outermost layer include TiC, TiN, and TiB$_2$.

The outermost layer preferably has a thickness of 0.1-1 μm, more preferably 0.3-0.8 μm. Such a thickness can be confirmed by observing a vertical cross section of the substrate and the coating with a scanning transmission electron microscope (STEM) or the like, similarly as has been described above.

(Another Layer)

The coating may further include another layer insofar as it does not impair an effect of the cutting tool according to the present embodiment. The other layer may have a composition different from or identical to that of the α-$Al_2O_3$ layer, the inner layer, the intermediate layer or the outermost layer. Examples of the compound included in the other layer include TiN, TiCN, TiBN, and $Al_2O_3$ for example. The other layer is not limited, either, in in what order it is stacked. While the other layer is not particularly limited in thickness as long as it does not impair an effect of the present embodiment, it is for example 0.1 μm or more and 20 μm or less.

<<Method for Manufacturing a Surface-Coated Cutting Tool>>

A method for manufacturing a cutting tool according to the present embodiment includes:

a first step of preparing the substrate (hereinafter also simply referred to as a "first step");

a second step of forming a lower portion of the α-$Al_2O_3$ layer on the substrate through chemical vapor deposition using a source gas including carbon dioxide gas and hydrogen sulfide gas (hereinafter also simply referred to as a "second step"); and a third step of forming an upper portion of the α-$Al_2O_3$ layer on the lower portion through chemical vapor deposition using a source gas including carbon dioxide gas and hydrogen sulfide gas (hereinafter also simply referred to as a "third step"), wherein 1≤(R1/R2)<1.5 being satisfied, where R1 represents a ratio in volume of the carbon dioxide gas to the hydrogen sulfide gas ($CO_2/H_2S$) in the second step, and R2 represents a ratio in volume of the carbon dioxide gas to the hydrogen sulfide gas ($CO_2/H_2S$) in the third step.

The middle portion can be understood as a "transition portion" formed while the second step is shifted to the third step.

<First Step: Step of Preparing a Substrate>

In the first step, a substrate is prepared. For example, a cemented carbide substrate is prepared as the substrate. The cemented carbide substrate may be a commercially available product or may be manufactured in a typical powder metallurgy method. When manufacturing the substrate in a typical powder metallurgy method, for example, WC powder and Co powder are mixed using a ball mill or the like to obtain a powdery mixture. After the powdery mixture is dried, it is shaped into a prescribed shape to obtain a shaped body. The shaped body is sintered to obtain a WC—Co based cemented carbide (a sintered material). Subsequently, the sintered material can be honed or subjected to a prescribed process for a cutting edge to prepare a substrate made of the WC—Co based cemented carbide. In the first step, any other substrate may be prepared insofar as it is a substrate conventionally known as a substrate of this type.

<Second Step: Step of Forming Lower Portion of α-$Al_2O_3$ Layer>

In the second step, a lower portion of the α-$Al_2O_3$ layer is formed on the substrate through chemical vapor deposition (CVD) using a source gas including carbon dioxide gas and hydrogen sulfide gas.

Figure 5:
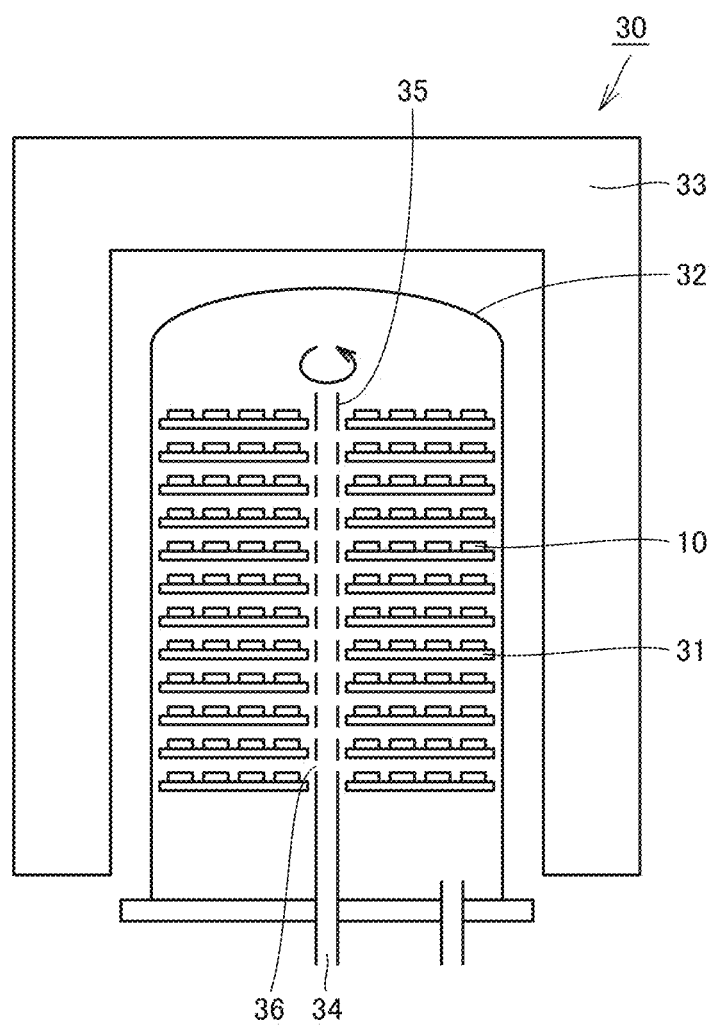
FIG. 5 is a schematic cross section showing an example of a chemical vapor deposition apparatus used for manufacturing a coating.

FIG. 5 is a schematic cross section showing an example of a chemical vapor deposition (CVD) apparatus used for manufacturing a coating. Hereinafter, the second step will be described with reference to FIG. 5. A CVD apparatus 30 includes a plurality of substrate setting jigs 31 for holding substrate 10, and a reaction chamber 32 made of heat-resistant alloy steel and covering substrate setting jigs 31. A temperature controller 33 is provided around reaction chamber 32 for controlling the temperature inside reaction chamber 32. Reaction chamber 32 is provided with a gas introduction pipe 35 having a gas introduction port 34. Gas introduction pipe 35 is disposed in an internal space of reaction chamber 32 in which substrate setting jig 31 is disposed, such that gas introduction pipe 35 extends in the vertical direction rotatably about the vertical direction, and is also provided with a plurality of jetting holes 36 for jetting gas into reaction chamber 32. CVD apparatus 30 can be used to form the lower portion and the like of the α-$Al_2O_3$ layer constituting the coating, as follows:

Initially, substrate 10 is placed on substrate setting jig 31, and a source gas for the lower portion of α-$Al_2O_3$ layer 20 is introduced into reaction chamber 32 through gas introduction pipe 35 while controlling temperature and pressure inside reaction chamber 32 to each fall within a prescribed range. Thus, lower portion 20A of α-$Al_2O_3$ layer 20 is formed on substrate 10. Note that, preferably, before forming lower portion 20A of α-$Al_2O_3$ layer 20 (that is, before the second step), an inner layer (a layer including TiCN (not shown)) is formed on a surface of substrate 10 by introducing a source gas for the inner layer through gas introduction pipe 35 into reaction chamber 32. Hereinafter will be described a method for forming lower portion 20A of α-$Al_2O_3$ layer 20 after the inner layer is formed on the surface of substrate 10.

While the source gas for the inner layer is not particularly limited, an example thereof is a gaseous mixture of $TiCl_4$, $N_2$, and $CH_3CN$.

In forming the inner layer, reaction chamber 32 is preferably controlled in temperature to 1000 to 1100° C. In forming the inner layer, reaction chamber 32 is preferably controlled in pressure to 0.1 to 1013 hPa. Note that $H_2$ is preferably used as a carrier gas. When introducing gas, it is preferable to rotate gas introduction pipe 35 by a drive unit (not shown). This allows each gas to be uniformly dispersed in reaction chamber 32.

Further, the inner layer may be formed through MT (Medium Temperature)-CVD. In contrast to CVD performed at a temperature of 1000 to 1100° C. (hereinafter also referred to as "HT-CVD"), MT-CVD is a method to form a layer by maintaining the temperature inside reaction chamber 32 at a relatively low temperature of 850 to 950° C. Since MT-CVD is performed at a lower temperature than HT-CVD, it can reduce damage to substrate 10 caused by heating. In particular, when the inner layer is a TiCN layer, it is preferable to form it through MT-CVD.

Subsequently, lower portion 20A of α-$Al_2O_3$ layer 20 is formed on the inner layer. As the source gas, a gaseous mixture of $AlCl_3$, HCl, CO, $CO_2$, and $H_2S$ is used for example.

The source gas preferably contains 0.1 to 6% by volume, more preferably 0.5 to 3% by volume, still more preferably 0.6 to 2.5% by volume of $CO_2$. $CO_2$ preferably has a flow rate of 0.1 to 4 L/min.

The source gas preferably contains 0.1 to 1% by volume, more preferably 0.5 to 1% by volume, still more preferably 0.5 to 0.8% by volume of $H_2S$. $H_2S$ preferably has a flow rate of 0.1 to 0.5 L/min.

A ratio in volume of $CO_2$ to $H_2S$ ($CO_2/H_2S$) is preferably 0.5 to 4, more preferably 0.5 to 2.

The source gas preferably contains 2 to 5% by volume, more preferably 3 to 4% by volume of $AlCl_3$. $AlCl_3$ preferably has a flow rate of 2.4 L/min for example.

The source gas preferably contains 1 to 4% by volume, more preferably 2 to 3.5% by volume of HCl. HCl preferably has a flow rate of 2 L/min for example.

The source gas preferably contains 0.1 to 4% by volume of CO. CO preferably has a flow rate of 0.1 to 2 L/min.

Reaction chamber 32 is preferably controlled in temperature to 950 to 1000° C. Reaction chamber 32 is preferably controlled in pressure to 50 to 100 hPa. Controlling the temperature within the above range facilitates forming a fine grain structure of $\alpha\text{-}Al_2O_3$. $H_2$ can be used as a carrier gas. It is preferable, similarly as has been described above, to rotate gas introduction pipe 35 when introducing the gases.

In the above manufacturing method, each layer is varied in manner by controlling each condition for CVD. For example, each layer's composition is determined by a composition of a source gas introduced into reaction chamber 32. Each layer is controlled in thickness by execution time (or deposition time). In particular, in order to reduce a ratio of coarse grains in $\alpha\text{-}Al_2O_3$ layer 20 or increase (006) plane orientation in the third step described hereinafter, it is important to control a flow rate ratio of $CO_2$ gas and $H_2S$ gas ($CO_2/H_2S$) in the source gas.

<Third Step: Step of Forming Upper Portion of $\alpha\text{-}Al_2O_3$ Layer>

In the third step, an upper portion of the $\alpha\text{-}Al_2O_3$ layer is formed on the lower portion through chemical vapor deposition using a source gas including carbon dioxide gas and hydrogen sulfide gas.

As the source gas, a gaseous mixture of $AlCl_3$, HCl, $CO_2$, and $H_2S$ is used for example.

The source gas preferably contains 0.15 to 8% by volume, more preferably 0.5 to 3% by volume, still more preferably 0.6 to 2.5% by volume of $CO_2$. $CO_2$ preferably has a flow rate of 0.1 to 4 L/min.

The source gas preferably contains 0.15 to 1% by volume, more preferably 0.5 to 1% by volume, more preferably 0.5 to 0.8% by volume of $H_2S$. $H_2S$ preferably has a flow rate of 0.1 to 0.5 L/min.

A ratio in volume of $CO_2$ to $H_2S$ ($CO_2/H_2S$) is preferably 0.5 to 4, more preferably 0.5 to 2.

Furthermore it is preferable to satisfy $1 \leq (R1/R2) < 1.5$, where R1 represents a ratio in volume of $CO_2$ to $H_2S$ ($CO_2/H_2S$) in the second step, and R2 represents a ratio in volume of $CO_2$ to $H_2S$ ($CO_2/H_2S$) in the third step.

The source gas preferably contains 6 to 12% by volume, more preferably 8 to 10% by volume of $AlCl_3$. $AlCl_3$ preferably has a flow rate of 4.8 L/min for example.

The source gas preferably contains 1 to 4% by volume, more preferably 1.5 to 3% by volume of HCl. HCl preferably has a flow rate of 1 L/min for example.

Reaction chamber 32 is preferably controlled in temperature to 950 to 1000° C. Reaction chamber 32 is preferably controlled in pressure to 50 to 100 hPa. Controlling the temperature within the above range facilitates growth of crystal grains of $\alpha\text{-}Al_2O_3$. $H_2$ can be used as a carrier gas. It is preferable, similarly as has been described above, to rotate gas introduction pipe 35 when introducing the gas.

<Another Step>

In the manufacturing method according to the present embodiment, in addition to the steps described above, an additional step may be performed, as appropriate, within a range that does not impair an effect of the present embodiment. Examples of the additional step include the step of forming an intermediate layer between the inner layer and the $\alpha\text{-}Al_2O_3$ layer, the step of forming an outermost layer on the $\alpha\text{-}Al_2O_3$ layer, the step of blasting the coating, and the like. The intermediate layer and the outermost layer may be formed in any method, and the layers are formed for example through CVD.

What has been described above includes features given in the following notes.

(Note 1)

A surface-coated cutting tool comprising a substrate and a coating that coats the substrate, the coating including an $\alpha\text{-}Al_2O_3$ layer provided on the substrate, the $\alpha\text{-}Al_2O_3$ layer including crystal grains of $\alpha\text{-}Al_2O_3$, the $\alpha\text{-}Al_2O_3$ layer including a lower portion and an upper portion, the lower portion being a region sandwiched between an imaginary plane A and an imaginary plane B, the imaginary plane A being an imaginary plane which passes through a point 0.2 μm away in a direction of thickness from a first interface located on a side of the substrate and is parallel to the first interface, the imaginary plane B being an imaginary plane which passes through a point 1.3 μm further away from the imaginary plane A in the direction of thickness and is parallel to the first interface, the upper portion being a region sandwiched between an imaginary plane C and an imaginary plane D, the imaginary plane C being an imaginary plane which passes through a point 0.5 μm away in the direction of thickness from a second interface opposite to the side of the substrate and is parallel to the second interface, the imaginary plane D being an imaginary plane which passes through a point 1 μm further away from the imaginary plane C in the direction of thickness and is parallel to the second interface, the first interface being parallel to the second interface, when a cross section of the $\alpha\text{-}Al_2O_3$ layer obtained when cut along a plane including a normal to the second interface is subjected to an electron backscattering diffraction image analysis using a field emission scanning microscope to determine a crystal orientation of each of the crystal grains of $\alpha\text{-}Al_2O_3$ and a color map is created based thereon, then, in the color map, the upper portion being occupied in area at a ratio of 50% or more by crystal grains of $\alpha\text{-}Al_2O_3$ having a (006) plane with a normal thereto having a direction within ±15° with respect to a direction of the normal to the second interface, the lower portion being occupied in area at a ratio of 5% or more and less than 50% by crystal grains of $\alpha\text{-}Al_2O_3$ having a (012) plane, a (104) plane, a (110) plane, a (113) plane, a (116) plane, a (300) plane, a (214) plane and a (006) plane each with a normal thereto having a direction within ±15° with respect to the direction of the normal to the second interface.

(Note 2)

The surface-coated cutting tool according to note 1, wherein the $\alpha\text{-}Al_2O_3$ layer has a thickness of 3 μm or more and 20 μm or less.

(Note 3)

The surface-coated cutting tool according to note 1 or 2, wherein the coating further includes an inner layer provided between the substrate and the $\alpha\text{-}Al_2O_3$ layer, and the inner layer includes TiCN.

(Note 4)

The surface-coated cutting tool according to any one of notes 1 to 3, wherein the coating further includes an intermediate layer provided between the inner layer and the α-Al$_2$O$_3$ layer, the intermediate layer includes a compound composed of: elemental titanium; and at least one element selected from the group consisting of C, N, B and O, and the intermediate layer is different in composition from the inner layer.

(Note 5)

The surface-coated cutting tool according to any one of notes 1 to 4, wherein the coating further includes an outermost layer provided on the α-Al$_2$O$_3$ layer, and the outermost layer includes a compound composed of: an elemental titanium; and one element selected from the group consisting of C, N and B.

(Note 6)

The surface-coated cutting tool according to any one of notes 1 to 5, wherein the coating has a thickness of 3 μm or more and 30 μm or less.

EXAMPLES

Hereinafter, the present invention will more specifically be described with reference to examples although the present invention is not limited thereto.

<<Manufacturing a cutting tool>>

<First Step: Step of Preparing a Substrate>

As a substrate was prepared a cutting insert of cemented carbide (shape: CNMG120408 N-UX, manufactured by Sumitomo Electric Hardmetal Ltd., JIS B4120 (2013)) having a composition composed of TaC (2.0% by mass), NbC (1.0% by mass), Co (10.0% by mass) and WC (balance) (including unavoidable impurity).

<Step of Forming Inner and Intermediate Layers>

Before the second step described hereinafter is performed, a CVD apparatus was employed to form an inner layer and an intermediate layer in the stated order on the prepared substrate. Each layer was formed under the conditions indicated below. Note that a value in parentheses following each gas composition indicates a flow rate (L/min) of each gas. Table 1 shows the thickness of the inner layer and that of the intermediate layer, and the composition of the intermediate layer for each sample.

(Inner layer: TiCN)
Source gas: TiCl$_4$ (12 L/min), CH$_3$CN (2 L/min), N$_2$ (15 L/min), H$_2$ (80 L/min)
Pressure: 100 hPa
Temperature: 860° C.
Deposition Time: adjusted, as appropriate, to provide thickness shown in Table 1.

(Intermediate layer: TiCNO, TiCN, or TiBN)
(For TiCNO)
Source gas: TiCl$_4$ (0.5 L/min), CH$_4$ (3 L/min), CO (0.5 L/min), N$_2$ (30 L/min), H$_2$ (55 L/min)
Pressure: 150 hPa
Temperature: 980° C.
Deposition Time: adjusted, as appropriate, to provide thickness shown in Table 1.

(For TiCN)
Source gas: TiCl$_4$ (4 L/min), CH$_3$CN (2 L/min), N$_2$ (25 L/min), H$_2$ (75 L/min)
Pressure: 90 hPa
Temperature: 970° C.
Deposition Time: adjusted, as appropriate, to provide thickness shown in Table 1.

(For TiBN)
Source gas: TiCl$_4$ (5 L/min), BCl$_3$ (0.7 L/min), N$_2$ (20 L/min), H$_2$ (70 L/min)
Pressure: 70 hPa
Temperature: 960° C.
Deposition Time: adjusted, as appropriate, to provide thickness shown in Table 1.

<Second Step: Step of Forming a Lower Portion of α-Al$_2$O$_3$ Layer>

A CVD apparatus was employed to form a lower portion of the α-Al$_2$O$_3$ layer on the substrate having the inner and intermediate layers formed thereon, followed by a subsequent, third step. The lower portion of the α-Al$_2$O$_3$ layer was formed under the following conditions. Table 1 shows the thickness of the α-Al$_2$O$_3$ layer for each example.

(Lower portion of α-Al$_2$O$_3$ layer)
Source gas: AlCl$_3$ (2.4 L/min), CO$_2$ (0.1 to 4.0 L/min), CO (0.1 to 2.0 L/min), H$_2$S (0.1 to 0.5 L/min), HCl (2.0 L/min), H$_2$ (65 L/min)
Pressure: 50 to 100 hPa
Temperature: 950 to 1000° C.
Deposition Time: adjusted, as appropriate, to provide the lower portion with a thickness of 2 micrometers.

<Third Step: Step of Forming an Upper Portion of α-Al$_2$O$_3$ Layer>

Subsequently, a CVD apparatus was employed to form an upper portion of the α-Al$_2$O$_3$ layer on the substrate that had formed thereon the lower portion of the α-Al$_2$O$_3$ layer to thus form the α-Al$_2$O$_3$ layer. The upper portion of the α-Al$_2$O$_3$ layer was formed under the following conditions. Table 1 shows a ratio R1/R2, where R1 represents a ratio in volume of CO$_2$ to H$_2$S (CO$_2$/H$_2$S) in the second step, and R2 represents a ratio in volume of CO$_2$ to H$_2$S (CO$_2$/H$_2$S) in the third step.

(Upper Portion of α-Al$_2$O$_3$ Layer)
Source gas: AlCl$_3$ (4.8 lmin), CO$_2$ (0.1 to 4.0 L/min), H$_2$S (0.1 to 0.5 L/min), HCl (1.0 L/min), H$_2$ (45 L/min)
Pressure: 50 to 100 hPa
Temperature: 950-1000° C.
Deposition Time: adjusted, as appropriate, so that the lower and upper portions together have a total thickness as shown in Table 1.

TABLE 1

| samples | inner layer (TiCN layer) thickness (μm) | intermediate layer thickness (μm) | α-Al$_2$O$_3$ layer thickness (μm) | outermost layer thickness (μm) | CO$_2$/H$_2$S when providing deposition R1/R2 |
|---|---|---|---|---|---|
| 1 | 7.2 | TiCNO (0.5) | 6.5 | TiN (0.8) | 1.2 |
| 2 | 8.4 | TiBN (0.5) | 13.2 | TiB$_2$ (0.4) | 1.4 |
| 3 | 13.5 | TiCN (0.8) | 8.7 | TiC (0.4) | 1.1 |
| 4 | 8.4 | TiBN (0.3) | 4.3 | TiN (0.6) | 1.3 |
| 5 | 5.5 | TiCNO (0.5) | 19.3 | TiC (0.3) | 1.2 |
| 6 | 3.3 | TiBN (0.8) | 21.6 | TiN (0.6) | 1.3 |
| 7 | 8.7 | TiCNO (0.8) | 6.3 | none | 1.1 |
| 8 | 4.5 | TiCNO (0.5) | 7.2 | none | 1.2 |
| 9 | 5.6 | TiCNO (1.2) | 6.5 | TiC (0.7) | 1.4 |
| 10 | 7 | TiBN (2.5) | 9.4 | TiB$_2$ (0.4) | 1.4 |
| 11 | 3.3 | TiCNO (1.2) | 13.8 | TiC (0.6) | 1.3 |
| 12 | 4.8 | TiCNO (1.5) | 6.5 | TiB$_2$ (0.3) | 1.2 |
| a | 5.5 | TiCNO (0.5) | 5 | TiN (0.5) | 2.3 |
| b | 6.2 | TiBN (0.3) | 3.4 | TiB$_2$ (0.5) | 2.7 |
| c | 6.5 | TiCNO (0.5) | 3.2 | none | 3.1 |
| d | 9.1 | TiBN (0.3) | 4.5 | TiN (0.3) | 3.2 |
| e | 5.8 | TiCNO (0.8) | 7.8 | TiC (0.3) | 2.8 |
| f | 7.2 | TiBN (1.0) | 5.2 | TiN (0.2) | 3.3 |

<Step of Forming an Outermost Layer>

Finally, a CVD apparatus was employed to form an outermost layer on the substrate having the $\alpha$-$Al_2O_3$ layer formed thereon (except for Samples 7, 8 and c). The outermost layer was formed under the conditions indicated below. Table 1 shows the thickness and composition of the outermost layer for each sample.

(Outermost layer: TiN, TiC, or $TiB_2$)

(For TiN)

Source gas: $TiCl_4$ (5 L/min), $N_2$ (20 L/min), $H_2$ (75 L/min)

Pressure: 150 hPa

Temperature: 980° C.

Deposition Time: adjusted, as appropriate, to provide thickness shown in Table 1.

(For TiC)

Source gas: $TiCl_4$ (3/min), $CH_4$ (5 L/min), $H_2$ (90 L/min)

Pressure: 400 hPa

Temperature: 1000° C.

Deposition Time: adjusted, as appropriate, to provide thickness shown in Table 1.

(For $TiB_2$)

Source gas: $TiCl_4$ (10 L/min), $BCl_3$ (0.2 L/min), $H_2$ (80 L/min)

Pressure: 350 hPa

Temperature: 995° C.

Deposition Time: adjusted, as appropriate, to provide thickness shown in Table 1.

Through the above procedure, cutting tools for samples 1 to 12 and samples a to f were manufactured.

<<Evaluating Characteristics of Cutting Tools>>

Using the cutting tools of the samples manufactured as described above, the cutting tools' characteristics were evaluated as follows: Note that samples 1 to 12 correspond to examples, and samples a to f correspond to comparative examples.

<Creating a Color Map>

Initially, the cutting tool was cut so that a cross section perpendicular to a surface (or an interface) of the $\alpha$-$Al_2O_3$ layer in the coating was obtained. Subsequently, the cut surface was polished with waterproof abrasive paper (manufactured by Noritake Coated Abrasive Co., Ltd. (NCA), trade name: WATERPROOF PAPER, #400, #800, #1500) to prepare a processed surface of the $\alpha$-$Al_2O_3$ layer. Subsequently, the processed surface is further smoothed by ion milling using Ar ions. The ion milling was performed under the following conditions:

Acceleration voltage: 6 kV

Irradiation angle: 0° from the direction of a normal to the second interface of the $\alpha$-$Al_2O_3$ layer (that is, the direction of a straight line parallel to the direction of the thickness of the $\alpha$-$Al_2O_3$ layer in the cut surface)

Irradiation time: 6 hours

The thus prepared processed surface was observed with an EBSD equipped FE-SEM (trade name: "SU6600" manufactured by Hitachi High-Technologies Corporation) at a magnification of 5000 times to create a color map, as described above, of the processed surface for an observation area of 20 μm (in the direction of the thickness of the $\alpha$-$Al_2O_3$ layer)×30 μm (in a direction parallel to an interface of the $\alpha$-$Al_2O_3$ layer). Three such color maps were created (in other words, measurement was done in three fields of view). Specifically, initially, the crystal orientation of each crystal grain included in the cross section of the $\alpha$-$Al_2O_3$ layer was determined. The crystal orientation of each crystal grain as determined herein is a crystal orientation observed when each crystal grain appearing in the cross section of the $\alpha$-$Al_2O_3$ layer is viewed in a plan view in the direction of a normal to that cross section (that is, a direction penetrating the plane of the sheet of FIG. 4). Based on the crystal orientation of each crystal grain determined, the crystal orientation of each crystal grain in the direction of the normal to the second interface of the $\alpha$-$Al_2O_3$ layer was determined. A color map was created based on the determined crystal orientation (for example, see FIG. 4). For each color map, a ratio in area of the $\alpha$-$Al_2O_3$ layer at the lower portion occupied by (110) oriented crystal grains, a ratio in area of the $\alpha$-$Al_2O_3$ layer at the lower portion occupied by (012) oriented crystal grains, a ratio in area of the $\alpha$-$Al_2O_3$ layer at the lower portion occupied by (104) oriented crystal grains, a ratio in area of the $\alpha$-$Al_2O_3$ layer at the lower portion occupied by (113) oriented crystal grains, a ratio in area of the $\alpha$-$Al_2O_3$ layer at the lower portion occupied by (116) oriented crystal grains, a ratio in area of the $\alpha$-$Al_2O_3$ layer at the lower portion occupied by (300) oriented crystal grains, a ratio in area of the $\alpha$-$Al_2O_3$ layer at the lower portion occupied by (214) oriented crystal grains and a ratio in area of the $\alpha$-$Al_2O_3$ layer at the lower portion occupied by (006) oriented crystal grains, and a ratio in area of the $\alpha$-$Al_2O_3$ layer at the upper portion occupied by (006) oriented crystal grains were determined using commercially available software (trade name: "Orientation Imaging Microscopy Ver 6.2" manufactured by EDAX Inc.). A result thereof is shown in table 2 and FIG. 6. Note that the lower portion is a region sandwiched between an imaginary plane A and an imaginary plane B, the imaginary plane A being an imaginary plane which passes through a point 0.2 μm away in a direction of thickness from a first interface located on a side of the substrate and is parallel to the first interface, the imaginary plane B being an imaginary plane which passes through a point 1.3 μm further away from the imaginary plane A in the direction of thickness and is parallel to the first interface (see FIG. 4 for example). The upper portion is a region sandwiched between an imaginary plane C and an imaginary plane D, the imaginary plane C being an imaginary plane which passes through a point 0.5 μm away in the direction of thickness from a second interface opposite to the side of the substrate and is parallel to the second interface, the imaginary plane D being an imaginary plane which passes through a point 1 μm further away from the imaginary plane C in the direction of thickness and is parallel to the second interface (see FIG. 4 for example).

Herein, the first interface and the second interface were defined in the color map, as follows: Initially, in the color map, the area of the $\alpha$-$Al_2O_3$ layer and that other than the $\alpha$-$Al_2O_3$ layer were differently colored and displayed so that they were distinguishable. A straight line that passes a center between a straight line L1 that passes through a point on the side of the substrate farthest from the substrate in the direction of a normal to a major surface of the substrate in the color map and is also parallel to the major surface of the substrate and a straight line L2 that passes through a point on the side of the substrate closest to the substrate in the same direction and is also parallel to the major surface of the substrate is defined as the first interface. A straight line that passes a center between a straight line M1 that passes through a point on the side opposite to the substrate farthest from the substrate in the direction of the normal to the major surface of the substrate in the color map and is also parallel to the major surface of the substrate and a straight line M2 that passes through a point on the side opposite to the substrate closest to the substrate in the same direction and is also parallel to the major surface of the substrate is defined as the second interface.

TABLE 2

EBSD color map analysis of α-Al$_2$O$_3$ layer

| samples | areal ratio in upper portion (%) (006) plane | areal ratio in lower portion (%) | | | | | | | |
|---|---|---|---|---|---|---|---|---|---|
| | | (012) plane | (104) plane | (110) plane | (113) plane | (116) plane | (300) plane | (214) plane | (006) plane |
| 1 | 81 | 28 | 29 | 7 | 32 | 30 | 17 | 28 | 22 |
| 2 | 85 | 25 | 19 | 28 | 29 | 38 | 7 | 32 | 30 |
| 3 | 81 | 20 | 29 | 28 | 19 | 25 | 23 | 16 | 18 |
| 4 | 69 | 29 | 25 | 30 | 35 | 20 | 31 | 19 | 8 |
| 5 | 78 | 30 | 29 | 25 | 28 | 17 | 30 | 32 | 7 |
| 6 | 85 | 22 | 19 | 29 | 25 | 10 | 16 | 27 | 24 |
| 7 | 72 | 28 | 24 | 17 | 31 | 18 | 12 | 25 | 27 |
| 8 | 84 | 26 | 17 | 23 | 18 | 11 | 19 | 28 | 25 |
| 9 | 57 | 21 | 18 | 13 | 16 | 23 | 19 | 23 | 25 |
| 10 | 79 | 30 | 25 | 19 | 9 | 21 | 26 | 18 | 24 |
| 11 | 81 | 28 | 25 | 22 | 10 | 12 | 21 | 25 | 19 |
| 12 | 63 | 23 | 18 | 27 | 24 | 16 | 8 | 19 | 20 |
| a | 29 | 5 | 10 | 5 | 20 | 72 | 4 | 3 | 1 |
| b | 52 | 4 | 25 | 4 | 10 | 68 | 1 | 2 | 2 |
| c | 41 | 10 | 1 | 21 | 70 | 1 | 12 | 2 | 0 |
| d | 19 | 12 | 5 | 3 | 10 | 58 | 9 | 7 | 12 |
| e | 34 | 11 | 18 | 32 | 20 | 2 | 21 | 14 | 0 |
| f | 28 | 3 | 18 | 6 | 5 | 25 | 4 | 72 | 0 |

Figure 6:
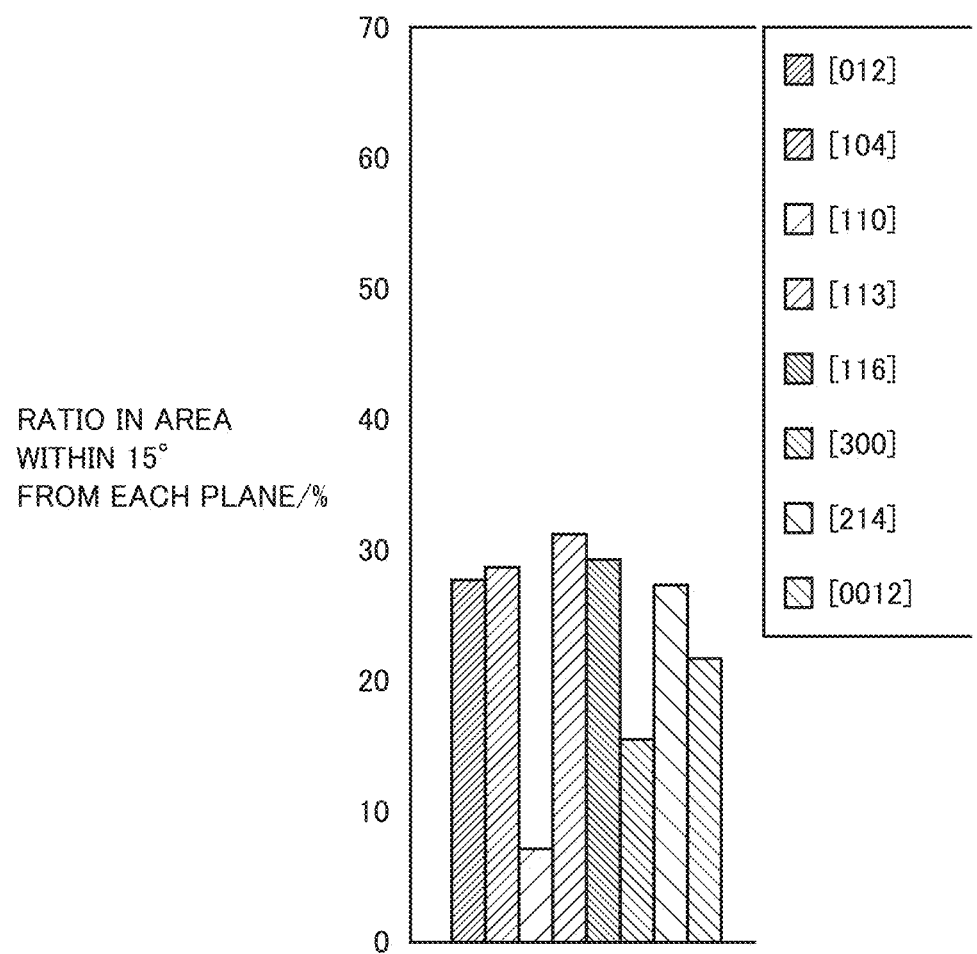
FIG. 6 is a graph representing a ratio in area of the $\alpha$-$Al_2O_3$ layer at a lower portion occupied by crystal grains for each crystal plane, the crystal grains having a prescribed crystal plane with a normal thereto having a direction within ±15° with respect to the direction of the normal to the second interface.

FIG. 6 is a graph representing a ratio in area of the α-Al$_2$O$_3$ layer of sample no. 1 at a lower portion occupied by crystal grains for each crystal plane, the crystal grains having a prescribed crystal plane with a normal thereto having a direction within ±15° with respect to the direction of the normal to the second interface. Crystal planes for which a ratio in area is determined are the (110) plane, and in addition, the (012) plane, the (104) plane, the (113) plane, the (116) plane, the (300) plane, the (214) plane, and the (006) plane. From the result shown in FIG. 6, it has been found that the α-Al$_2$O$_3$ layer of sample no. 1 had a lower portion occupied in area at a ratio of 5% or more and less than 50% by crystal grains having the (012) plane, the (104) plane, the (113) plane, the (116) plane, the (300) plane, the (214) plane, or the (006) plane with a normal thereto having a direction within ±15° with respect to the direction of the normal to the second interface.

<<Cutting Test>>

(Cutting Evaluation (1): Intermittent Processing Test)

Using the cutting tools of the samples (Samples 1 to 12 and Samples a to f) manufactured as described above, how many times an impact was received before the cutting edge was chipped was measured. A result thereof is shown in Table 3. A cutting tool that can receive the impact a larger number of times can be evaluated as a cutting tool having larger chipping resistance.

Test conditions for intermittent processing
Workpiece: SCM415 intermittent material
Cutting speed: 200 m/min
Feed rate: 0.25 mm/rev
Cutting Depth: 2 mm
Cutting oil: wet type (Cutting Evaluation (2): Continuous Processing Test)

The cutting tools of the samples (Samples 1 to 12 and Samples a to f) manufactured as described above were used under the following cutting conditions to cut a workpiece for 10 minutes and thereafter had their flank faces measured for an amount worn on average. A result thereof is shown in Table 3. A cutting tool worn in a smaller amount on average can be evaluated as a cutting tool having larger wear resistance.

Test conditions for continuous processing
Workpiece: SCr440H
Cutting speed: 250 m/min
Feed rate: 0.25 mm/rev
Cutting Depth: 2 mm
Cutting oil: wet type

TABLE 3

| samples | cutting evaluation (1) how many times an impact is received before chipping occurs | cutting evaluation (2) worn amount on average (mm) |
|---|---|---|
| 1 | 7650 | 0.06 |
| 2 | 8349 | 0.08 |
| 3 | 7329 | 0.07 |
| 4 | 6603 | 0.11 |
| 5 | 6024 | 0.1 |
| 6 | 4512 | 0.13 |
| 7 | 5835 | 0.09 |
| 8 | 4977 | 0.1 |
| 9 | 6003 | 0.11 |
| 10 | 5730 | 0.09 |
| 11 | 4212 | 0.12 |
| 12 | 4467 | 0.14 |
| a | 819 | 0.39 |
| b | 1230 | 0.29 |
| c | 1512 | 0.27 |
| d | 699 | 0.48 |
| e | 1188 | 0.27 |
| f | 792 | 0.38 |

As can be seen in Table 3, the cutting tools of samples 1-12 (the cutting tools of the examples) provided a good result, that is, they received the impact 4000 times or more in intermittent processing before their cutting edges were chipped. In contrast, the cutting tools of samples a to f (the cutting tools of the comparative examples) received the impact 2000 times or less in intermittent processing before their cutting edges were chipped. From the above results, it has been found that the cutting tools of the examples had larger chipping resistance than those of the comparative examples.

As can be seen in Table 3, the cutting tools of samples 1-12 (the cutting tools of the examples) provided a good result, that is, they had their flank faces worn in an amount of 0.14 mm or less on average in continuous processing. In contrast, the cutting tools of samples a to f (the cutting tools of the comparative examples) had their flank faces worn in an amount of 0.27 mm or more on average in continuous processing. From the above results, it has been found that the cutting tools of the examples had excellent wear resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST 1 rake face, 2 flank face, 3 cutting edge ridge portion, 10 substrate, 20 α-Al$_2$O$_3$ layer, 20a first interface, 20b second interface, 20A lower portion, 20B upper portion, 21 inner layer, 22 intermediate layer, 23 outermost layer, 30 CVD apparatus, 31 substrate setting jig, 32 reaction chamber, 33 temperature controller, 34 gas introduction port, 35 gas introduction pipe, 36 jetting hole, 40 coating, 50 cutting tool, A imaginary plane A, B imaginary plane B, C imaginary plane C, D imaginary plane D

The invention claimed is:

1. A cutting tool comprising a substrate and a coating that coats the substrate, the coating including an α-alumina layer provided on the substrate, the α-alumina layer including crystal grains of α-alumina, the α-alumina layer including a lower portion and an upper portion, the lower portion being a region sandwiched between an imaginary plane A and an imaginary plane B, the imaginary plane A being an imaginary plane which passes through a point 0.2 μm away in a direction of thickness from a first interface located on a side of the substrate and is parallel to the first interface, the imaginary plane B being an imaginary plane which passes through a point 1.3 μm further away from the imaginary plane A in the direction of thickness and is parallel to the first interface, the upper portion being a region sandwiched between an imaginary plane C and an imaginary plane D, the imaginary plane C being an imaginary plane which passes through a point 0.5 μm away in the direction of thickness from a second interface opposite to the side of the substrate and is parallel to the second interface, the imaginary plane D being an imaginary plane which passes through a point 1 μm further away from the imaginary plane C in the direction of thickness and is parallel to the second interface, the first interface being parallel to the second interface, when a cross section of the α-alumina layer obtained when cut along a plane including a normal to the second interface is subjected to an electron backscattering diffraction image analysis using a field emission scanning microscope to determine a crystal orientation of each of the crystal grains of α-alumina and a color map is created based thereon, then, in the color map, the upper portion being occupied in area at a ratio of 50% or more by crystal grains of α-alumina having a (006) plane with a normal thereto having a direction within ±15° with respect to a direction of the normal to the second interface, the lower portion being occupied in area at a ratio of 5% or more and less than 50% by crystal grains of α-alumina having a (012) plane, a (104) plane, a (110) plane, a (113) plane, a (116) plane, a (300) plane, a (214) plane and a (006) plane each with a normal thereto having a direction within ±15° with respect to the direction of the normal to the second interface, the α-alumina layer having a thickness of 3 μm or more and 20 μm or less.

2. The cutting tool according to claim 1, wherein the coating further includes an inner layer provided between the substrate and α-alumina layer, and the inner layer includes TiCN.

3. The cutting tool according to claim 2, wherein the coating further includes an intermediate layer provided between the inner layer and the α-alumina layer, the intermediate layer includes a compound composed of: elemental titanium; and at least one element selected from the group consisting of carbon, nitrogen, boron and oxygen, and the intermediate layer is different in composition from the inner layer.

4. The cutting tool according to claim 1, wherein the coating further includes an outermost layer provided on the α-alumina layer, and the outermost layer includes a compound composed of: an elemental titanium; and one element selected from the group consisting of carbon, nitrogen, and boron.

5. The cutting tool according to claim 1, wherein the coating has a thickness of 3 μm or more and 30 μm or less.

* * * * *